United States Patent [19]
Beyer et al.

[11] Patent Number: 5,405,795
[45] Date of Patent: Apr. 11, 1995

[54] METHOD OF FORMING A SOI TRANSISTOR HAVING A SELF-ALIGNED BODY CONTACT

[75] Inventors: Klaus D. Beyer, Poughkeepsie; Taqi N. Buti, Millbrook; Chang-Ming Hsieh; Louis L. Hsu, both of Fishkill, all of N.Y.

[73] Assignee: International Business Machines Corporation, Armonk, N.Y.

[21] Appl. No.: 268,380

[22] Filed: Jun. 29, 1994

[51] Int. Cl.⁶ .................................. H01L 21/265
[52] U.S. Cl. ............................ 437/41; 437/43; 437/89; 437/62; 148/DIG. 150
[58] Field of Search .............. 437/40, 41, 43, 62, 437/89, 90, 228, 913, 915; 148/Dig. 150

[56] References Cited
U.S. PATENT DOCUMENTS

| | | | |
|---|---|---|---|
| 4,946,799 | 8/1990 | Blake et al. | 437/41 |
| 5,059,547 | 10/1991 | Shirai | 437/62 |
| 5,066,613 | 11/1991 | Reedy et al. | 437/43 |
| 5,120,666 | 6/1992 | Gotou | 437/62 |
| 5,188,973 | 2/1993 | Omura et al. | 437/89 |
| 5,273,921 | 12/1993 | Neudeck et al. | 437/89 |

OTHER PUBLICATIONS

E. P. Ver Ploeg, et al., IEDM 1992, p. 33, "Elimination of Bipolar-Induced Breakdown in Fully-Depleted SOI MOSFETs".

*Primary Examiner*—Brian E. Hearn
*Assistant Examiner*—Tuan Nguyen

[57] ABSTRACT

An SOI transistor has a self-aligned body contact formed through an extension to the gate, thereby forming the body contact with minimal increase in area and also avoiding the need to tie the source to the body, as in prior art schemes that passed the body contact through the source. The body contact aperture is formed by raising the source and drain to define an initial aperture, depositing a conformal layer that is etched to create aperture-defining sidewalls and etching the contact aperture using these sidewalls to define sidewall support members that support insulating sidewalls to isolate the collection electrode from both the gate and from the source and drain.

10 Claims, 4 Drawing Sheets

5,405,795

METHOD OF FORMING A SOI TRANSISTOR HAVING A SELF-ALIGNED BODY CONTACT

TECHNICAL FIELD

The field of the invention is that of thin SOI integrated circuits, including circuits containing partially and fully depleted SOI transistors.

BACKGROUND ART

The art has long sought an economical way to handle the known problems of "kink" in the I-V curves of partially depleted SOI transistors and of parasitic latchup, both of which are related to the fact that the body of SOI transistors is floating unless it is connected to a potential.

In addition, fully depleted N-channel SOI MOSFETs suffer from low drain breakdown voltage that is due to the existence of an inherent parasitic n-p-n bipolar transistor effect, as reported by E. P. Ver Ploeg, et al in IEDM '92, page 33.

Various methods of making a contact to the body of a SOI transistor are known, but have various disadvantages such as reducing the amount of current that can be handled with a given transistor width or of taking up an excessive amount of space.

SUMMARY OF THE INVENTION

The invention relates to a SOI transistor that has a self-aligned body contact formed through the gate, thereby forming the body contact with minimal increase in area and also avoiding the need to tie the source to the body, as in prior art schemes that passed the body contact through the source.

BEST MODE OF CARRYING OUT THE INVENTION

The cure for the floating body problems in SOI transistors (formation of a body contact) is straightforward in principle, but difficult in practice. Connection to the body can be done, but at the cost of decreasing the transistor width if the contact is made through the source or drain, or of taking up unnecessary area if the contact is made outside the transistor. Transistors constructed according to the invention offer a reduction in space by the use of a self-aligned body contact through the gate.

Figure 7:
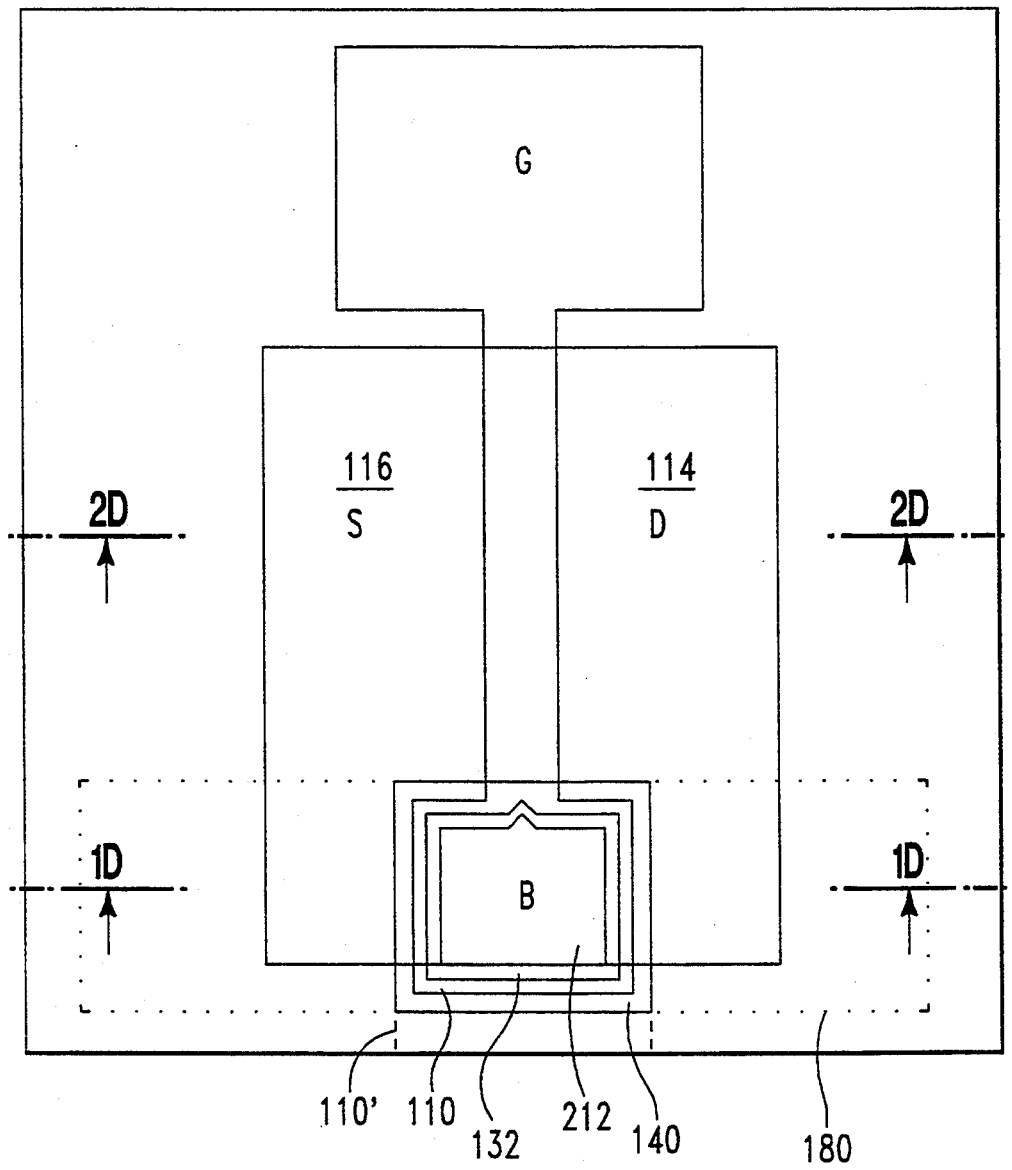
FIG. 7 shows a top view of the transistor of FIGS. 1-6.

In FIG. 7, a top view of a transistor constructed according to the invention shows source 116, and drain 114 separated by gate 110, which has self-aligned body contact 212 (the body contact being denoted generally by the numeral 210) formed at one end. For purposes of reference, a first axis will be referred to as being parallel to line 2D—2D, extending from the source to the drain and a second axis will be referred to as extending down the width of the gate. In FIGS. 1A-1D, there is shown in cross section through line 1D—1D in FIG. 7 where the body contact will be formed. A portion of a SOI wafer with a lower substrate 10, an SOI oxide ($SiO_2$) layer 50 and a portion of the thin silicon layer 102 that has been patterned and then isolated by a conventional step of oxidizing the unwanted portions of layer 102 to form oxide 60. In an illustrative embodiment, the length along the first axis (along the line 1D—1D) between the source and drain is about 1 $\mu$m or more and the corresponding gate length of the MOS device is <0.5 $\mu$m. Illustratively, layer 102 has a thickness of <80 nm.

Figure 1A:
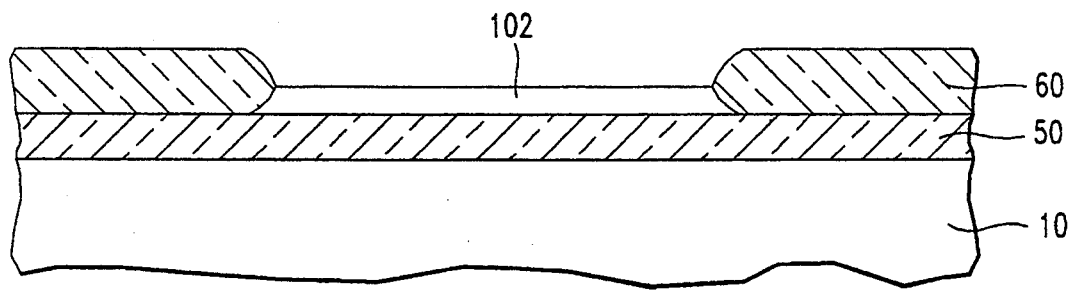
FIGS. 1A-1D show in cross section through a body contact, a portion of an SOI transistor used with the invention.
Figure 1B:
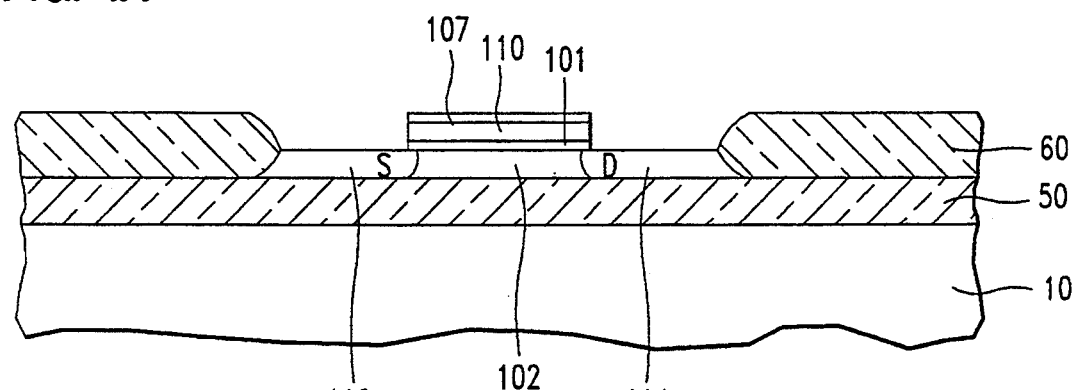

FIG. 1B shows the same area after a number of intermediate steps, A conventional gate stack of 5-10 nm of gate oxide 101, polycrystalline silicon (poly) layer 110 (in the range of 100-200 nm) which serves to provide the transistor gate and protective nitride ($Si_3N_4$) gate dielectric 107 (12 nm) have been formed and source 116 and drain 114 have been implanted and annealed.

Figure 1C:
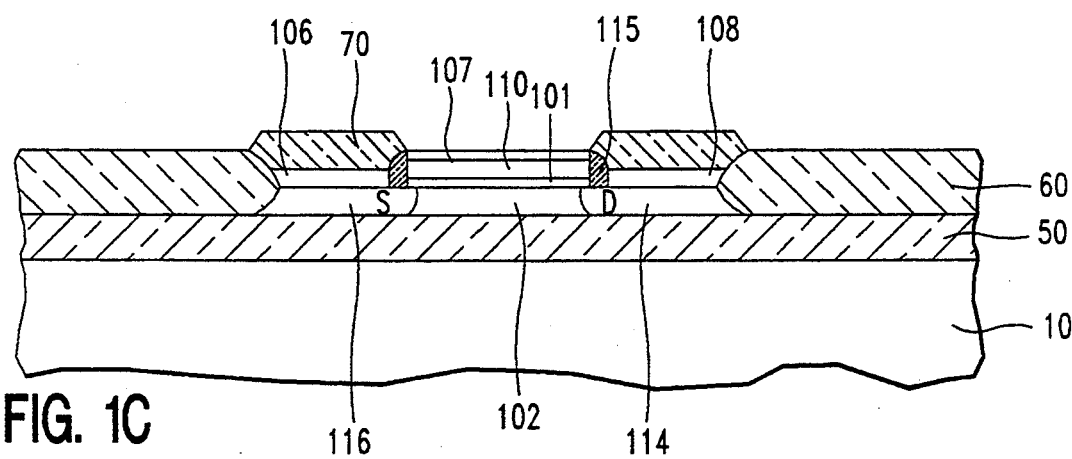
Figure 1D:
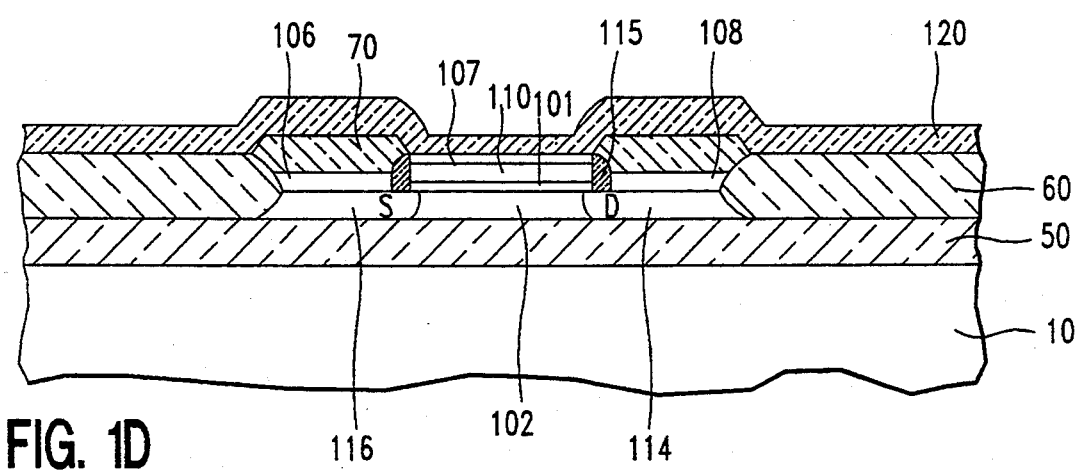
Figure 2A:
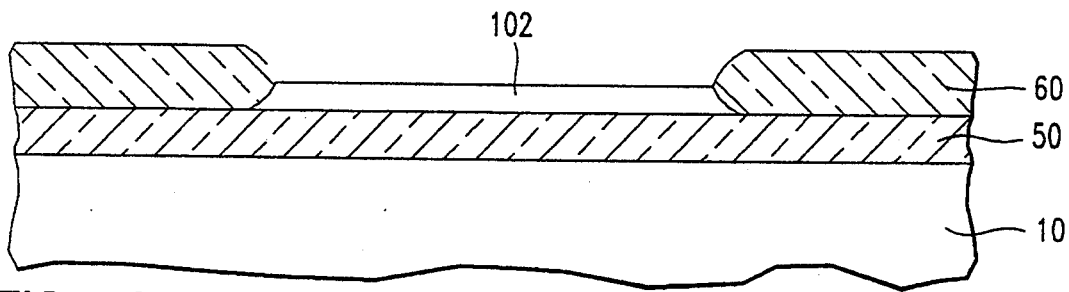
FIGS. 2A-2D show in cross section through the gate an SOI transistor used with the invention.
Figure 2B:
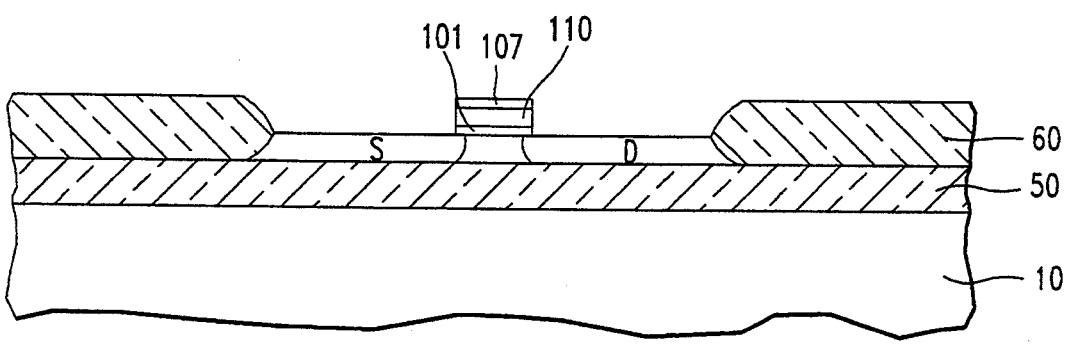
Figure 2C:
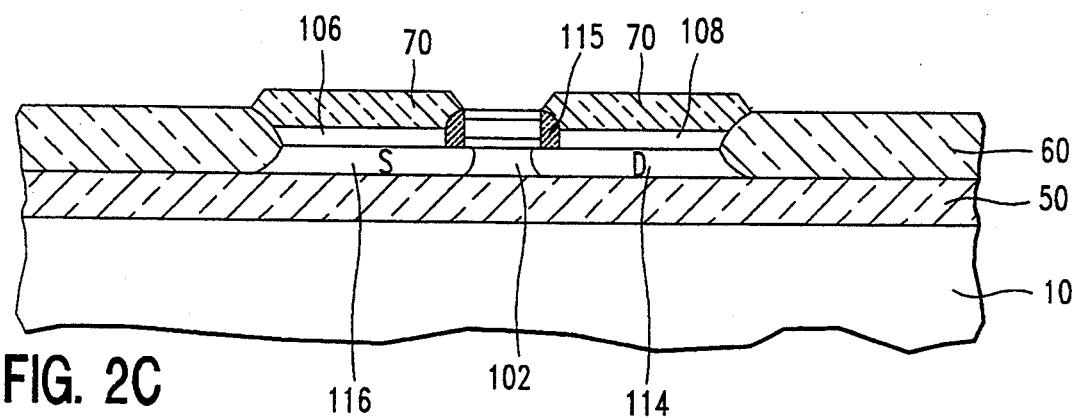
Figure 2D:
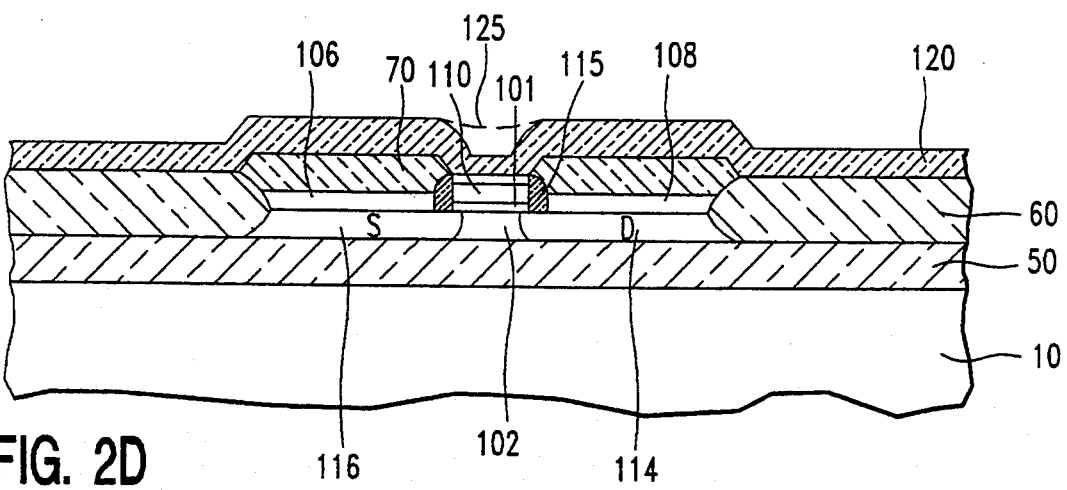

In FIG. 1C, a thin (10 nm) oxide layer has been grown on the edges of the gate stack, after which a 30 nm layer of CVD oxide have been deposited and etched to form outer gate sidewall spacers 115 in a conventional process.

These outer spacers are not only used to provide LDD sources and drains, but also serve to isolate the gate from the poly raised source and drain contact members 106 and 108 that are next formed by selectively depositing 150 nm of doped CVD poly in the apertures above the source and drain. The top of spacers 106 and 108 is sealed by thermal cap oxide 70 (120 nm). In the illustrative embodiment, the cap oxide projects above the top of gate dielectric 107 by an amount sufficient to define a self-aligned aperture in a later step. The deposition of a conformal layer of CVD nitride 120 (FIG. 1D) over the gate and having a thickness sufficient to provide sidewalls thick enough to protect the gate (greater than one half the gate thickness) completes the steps shown in this figure.

FIGS. 2A-2D show the same steps applied to the gate, through the cross section 2D—2D in FIG. 7. Note in FIG. 2D that the sidewalls of nitride 120 nearly meet over gate 110. A non-critical block out mask denoted in FIG. 7 by the dotted line labelled 180 is optionally used after the step shown in FIGS. 1D and 2D to expose the body contact area (212 in FIG. 7) only and to protect the gate. The dotted line 125 illustrates the situation when the thickness of nitride 120 is great enough that the sidewalls meet, referred to as the overlap thickness. In that case, the optional block out mask will not be needed. In the illustrative embodiment, if the top of the gate is a nominal 250 nm between source and drain and a thickness for nitride 120 of 150 nm will ensure that the gate is protected during the aperture etch without the need of a block-out mask.

Figure 3:
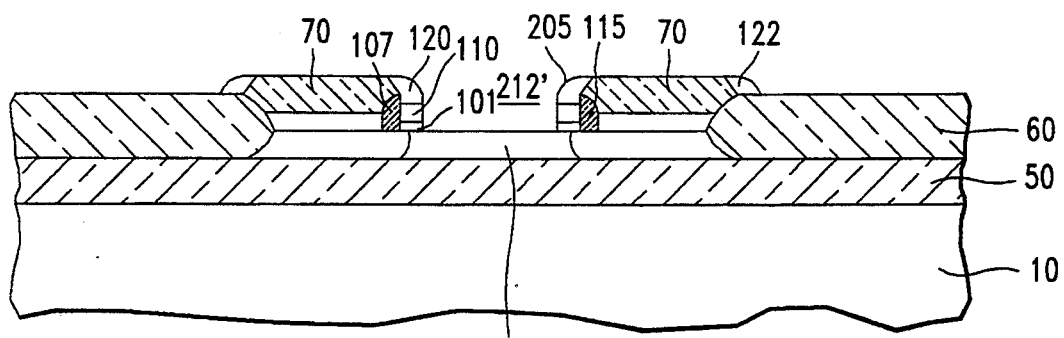
FIGS. 3-6 show in cross section a portion of the body contact at later steps.

FIG. 3 shows the same region through line 1D—1D after etching nitride layers 120 and 107 and poly layer 110 in a conventional three step nitride, poly, and oxide reactive ion etch (RIE) with appropriate gases, stopping on the silicon layer 102, and leaving an aperture 212' that will hold the body contact 212. At this stage, there is a sidewall member consisting of gate poly 110 above gate oxide 101 and top sidewalls formed from nitride 120, all denoted generally by the numeral 205, that is insulated from the source and drain by outer sidewalls 115. It will be apparent to those skilled in the art that there will need to be a corresponding sidewall within aperture 212' to insulate the body contact from gate extension 210.

Figure 4:
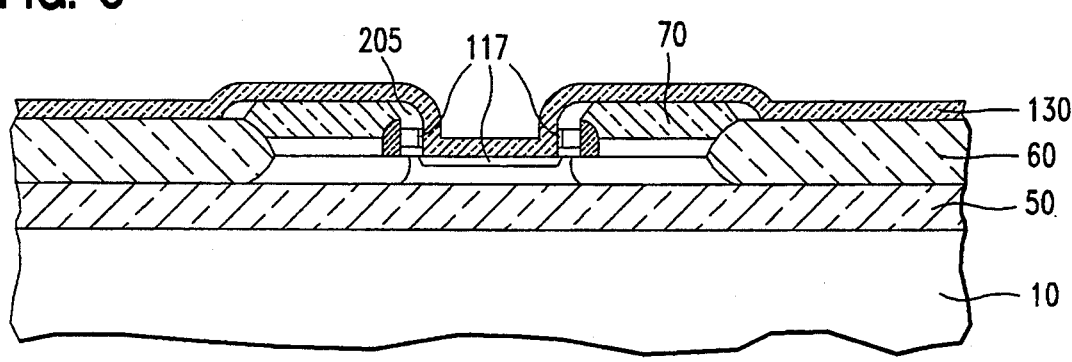
Figure 5:
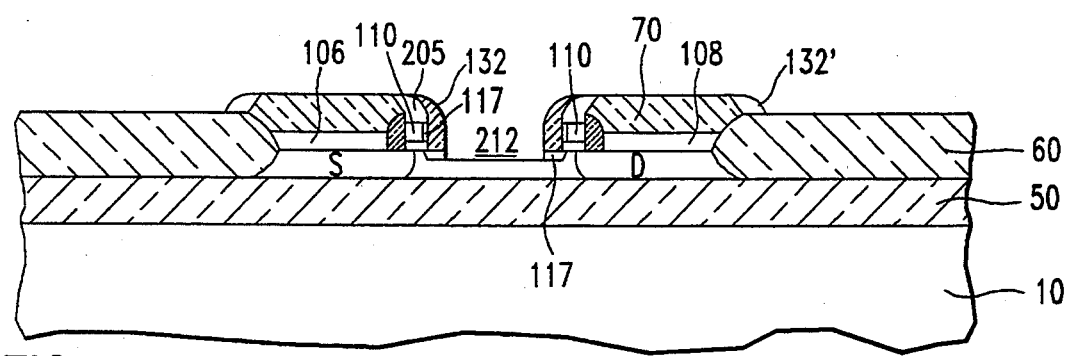
Figure 6:
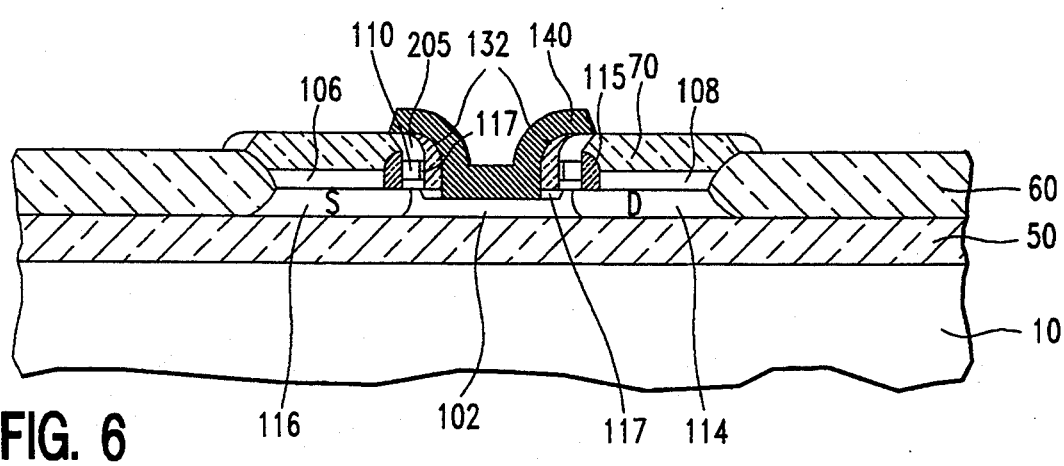

The next step is shown in FIG. 4, in which conformal CVD nitride (or oxide-nitride) layer 130 has been deposited over the wafer, extending into the inner wall and the bottom of gate extension aperture 212'. The areas denoted with the numeral 117 indicate an optional re-oxidation before deposition of layer 130 of the inner surface of poly 110 and the top of layer 102 that is exposed during the aperture definition process. Dielectric layer 130 is directionally etched in a conventional RIE process to access the substrate and form sidewalls 132 shown in FIG. 5. Lastly, a poly layer 140 is deposited, doped with an appropriate dopant, patterned and annealed to form the body contact, as shown in FIG. 6. The dopant for the body contact must have the same polarity as the body (P-type for an N-FET.

A gate contact and source and drain contacts may be formed in any convenient manner, after which any convenient back end processing may be used to complete the circuit.

Those skilled in the art will appreciate that the length of gate extension 110 is not critical, since it may extend along the first axis over the extension of the source and drain area as much as required, since the portion of the active area occupied by gate extension 110 does not contribute to the current flow through the transistor. Thus, the alignment of aperture 212' with gate extension 110 is not critical, since extension 110 may be made wide enough to provide a comfortable tolerance.

The extensions of gate 110 that form sidewall support members 205 surrounding aperture 212' serve to provide support for the internal and external sidewalls, thereby making a self-aligned aperture possible.

In the case of a fan-out or other circuit where two or more gates are tied together, the poly in gate 110 may extend along the gate axis to form the gate of an adjacent transistor (shown in FIG. 7 as dotted lines 110'), thus using the same body contact for both transistors and saving space.

Those skilled in the art will appreciate that many layouts may be used in which the gates of transistors may meet at a common point to share a body contact. In addition to the foregoing example of two transistors having their gates disposed an a common axis, two gates that are parallel and offset along an axis extending through the source and drain may have a gate extension linking the two gates along a perpendicular axis.

Alternatively, it may be desired to form the body contact aperture within a gate of uniform width. In that case, aperture 212 may be formed in the same step that patterns the gate, thus guaranteeing correct alignment of the aperture with the gate. This will be at the cost of a non-critical block out mask covering the aperture during the implantation of the source and drain, since the body contact must have the same polarity as the body.

As yet another alternative, aperture 212 may be opened after implantation of the source and drain and before deposition of layer 120, so that layer 120 will form the-required isolating sidewalls and layer 130 can be eliminated.

Those skilled the art will readily be able to devise modifications of the invention in the light of the disclosure and the following claims are not meant to be limited to the embodiment illustrated.

We claim:

1. A method of forming a SOI field effect transistor comprising a source and drain doped with a first polarity and formed in a silicon layer doped with a second polarity and disposed above an insulating substrate and a gate insulator and gate disposed above a body portion of said silicon layer between said source and drain, and having a gate extension connected to said gate and also disposed above said gate insulator and above a collection portion of said silicon layer, said body portion and said collection portion being in proximity; and a collection electrode doped with said second polarity and disposed in said silicon layer on a collection side of said gate extension, whereby minority carriers may flow from said body through said collection portion of said silicon layer to said collection electrode, comprising the steps of:

defining an active transistor area in said silicon layer;

forming a gate stack comprising a gate oxide, gate and gate dielectric having a gate dielectric top surface;

patterning said gate stack to define said gate and said gate extension and further defining source and drain areas adjacent said gate in said active area, whereby said gate has a gate length between said source and drain;

forming insulating gate sidewalls on edges of said gate adjacent said source and drain;

forming raised conductive source and drain members above said source and drain and isolated from said gate by said insulating gate sidewalls;

forming cap dielectric members above said raised source and drain members, said cap dielectric having a cap top surface higher than said gate dielectric top surface and having sidewall-defining edges adjacent said gate extension;

depositing a first conformal layer of an aperture-defining dielectric above said gate dielectric and cap dielectric, thereby defining an aperture location above said gate dielectric having a bottom covered with said first conformal dielectric and interior aperture sidewalls above said sidewall-defining edges of said cap dielectric;

etching directionally through said aperture-defining dielectric and said gate extension to form a collection electrode aperture, thereby forming a sidewall support member from that portion of said gate extension below said interior aperture sidewalls;

depositing a conformal sidewall layer of dielectric extending into said collection electrode aperture; and directionally etching said conformal sidewall layer of dielectric, thereby forming insulating interior sidewalls on interior walls of said collection aperture, said interior walls including a portion of said gate extension disposed between said collection aperture and said source and drain.

2. A method according to claim 1, in which said gate dielectric is formed from a layer of nitride, said raised source and drain members are formed from poly, and said step of forming cap dielectric members comprises growing a layer of thermal oxide above said poly raised source and drain members, whereby said cap dielectric members are self-aligned above said source and drain.

3. A method according to claim 1, in which said step of forming insulating gate sidewalls is followed by a step of implanting source and drain dopants.

4. A method according to claim 3, in which said step of etching directionally through said aperture-defining dielectric and said gate extension is followed by a step of oxidizing exposed portions of said gate.

5. A method according to claim 1, in which said step of depositing said aperture-defining dielectric includes depositing a layer having a thickness greater than about half of said gate length, whereby said layer of aperture-defining dielectric protects said gate during said step of etching directionally through said layer of aperture-defining dielectric.

6. A method according to claim 5, in which said gate dielectric is formed from a layer of nitride, said raised source and drain members are formed from poly, and said step of forming cap dielectric members comprises growing a layer of thermal oxide above said poly raised source and drain members, whereby said cap dielectric members are self-aligned above said source and drain.

7. A method according to claim 6, in which said step of forming insulating gate sidewalls is followed by a step of implanting source and drain dopants.

8. A method according to claim 7, in which said gate dielectric is formed from a layer of nitride, said raised source and drain members are formed from poly, and said step of forming cap dielectric members comprises growing a layer of thermal oxide above said poly raised source and drain members, whereby said cap dielectric members are self-aligned above said source and drain.

9. A method according to claim 8, in which said step of forming insulating gate sidewalls is followed by a step of implanting source and drain dopants.

10. A method according to claim 1, further including a step of protecting said gate with a non-critical blockout mask during said step of etching directionally through said aperture-defining dielectric.

* * * * *